(12) United States Patent
Grulich

(10) Patent No.: US 8,724,278 B2
(45) Date of Patent: May 13, 2014

(54) EFFICIENT INPUT VOLTAGE SENSING TECHNIQUE

(75) Inventor: Bc. Jan Grulich, Roznov pod Radhostem (CZ)

(73) Assignee: Fairchild Semiconductor Corporation, San Jose, CA (US)

( * ) Notice: Subject to any disclaimer, the term of this patent is extended or adjusted under 35 U.S.C. 154(b) by 118 days.

(21) Appl. No.: 13/102,667

(22) Filed: May 6, 2011

(65) Prior Publication Data

US 2012/0281326 A1 Nov. 8, 2012

(51) Int. Cl.
*H02H 3/20* (2006.01)

(52) U.S. Cl.
USPC .......................................... 361/91.2

(58) Field of Classification Search
USPC ........................................................ 361/91.2
See application file for complete search history.

(56) References Cited

U.S. PATENT DOCUMENTS

| | | | |
|---|---|---|---|
| 5,121,482 A * | 6/1992 | Patton | 710/16 |
| 6,330,143 B1 * | 12/2001 | Maly et al. | 361/101 |
| 6,809,594 B2 * | 10/2004 | Sutardja | 330/294 |

* cited by examiner

*Primary Examiner* — Stephen W Jackson
*Assistant Examiner* — Tien Mai
(74) *Attorney, Agent, or Firm* — Schwegman, Lundberg & Woessner, P.A.

(57) ABSTRACT

This document discusses, among other things, systems and methods for detecting a charging current from a startup circuit to a controller without power loss from a voltage divider, and for providing information representative of the charging current to the controller.

24 Claims, 5 Drawing Sheets

EFFICIENT INPUT VOLTAGE SENSING TECHNIQUE

BACKGROUND

Traditional voltage dividers (e.g., two or more resistors of a known ratio between an input voltage and ground) can be used to determine if an input line voltage is above or below a threshold. However, traditional voltage dividers constantly consume power as the input line voltage is divided.

OVERVIEW

This document discusses, among other things, systems and methods for detecting a charging current from a startup circuit to a controller without power loss from a voltage divider, and for providing information representative of the charging current to the controller.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, systems and methods configured to sense an input line voltage (e.g., of a pulse-width modulation (PWM) controller), such as a bulk voltage or other input voltage, without a power consuming voltage divider connected between from a bulk input voltage or other high voltage node directly to ground.

In certain examples, the systems and methods disclosed herein can use startup circuit charging current to sense the input line voltage, and can be implemented using relatively simple discrete components. In other examples, the systems and methods disclosed herein can be integrated into an integrated circuit (IC) including a high voltage current source for startup. In many examples, the systems and methods disclosed herein can reduce power loss, reduce self-consumption, increase the overall efficiency of the control circuitry, or significantly reduce stand-by consumption compared to systems and methods utilizing additional separate voltage dividers.

Figure 1:
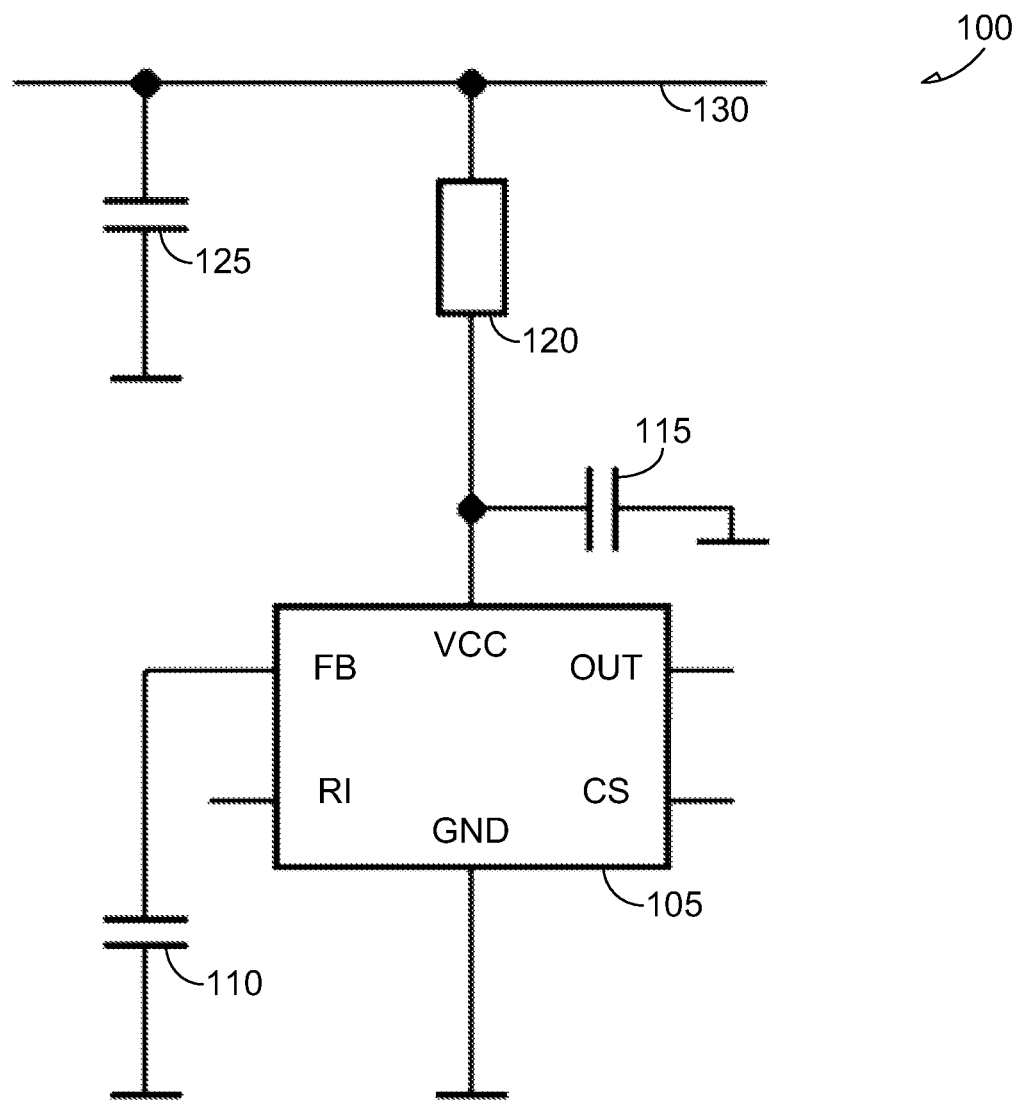
FIG. 1 illustrates generally an example of a system including a controller and additional circuitry.

FIG. 1 illustrates generally an example of a system 100 including a controller 105 and additional circuitry. In an example, the controller 105 can include a pulse width modulation (PWM) controller (e.g., a DC/DC controller, a light emitting diode (LED) driver, etc.) or other driver or controller including one or more pins. In the example of FIG. 1, the controller 105 includes an input voltage pin (VCC), a ground pin (GND), an output pin (OUT), a feedback pin (FB), a reference input pin (RI), and a current sense pin (CS). In other examples, the controller 105 can include one or more other pins. In certain examples, the controller 105 can be configured to receive power at VCC, such as from a bulk input voltage (VBULK) 130 or other input voltage, and provide one or more output voltages (e.g., regulated output voltages, etc.) at OUT.

In an example, the additional circuitry can include a feedback capacitor 110, a VCC capacitor 115, a startup resistor 120, and a bulk capacitor 125. In an example, the VCC capacitor 115 can be charged from VBULK 130 through the startup resistor 120. In an example, the controller 105 can begin to operate when the voltage at VCC reaches a threshold level (e.g., a minimum threshold voltage level to provide a desired output).

Traditional methods of detecting the input voltage included providing a voltage divider between an input voltage, VBULK, or one or more other high voltage nodes to ground and comparing the resulting divided voltage. However, these methods constantly consumed a large amount of power as the input voltage was divided. In certain examples, the systems and methods disclosed herein can detect the input voltage or the charging current without providing a direct path to ground through a voltage divider (e.g., two or more resistors configured to provide a reference voltage as a ratio of the input voltage with respect to ground). In an example, the systems and method disclosed herein can detect the input voltage or the charging current without providing a direct path to ground from the startup resistor 120 to ground directly through another resistor.

Figure 2:
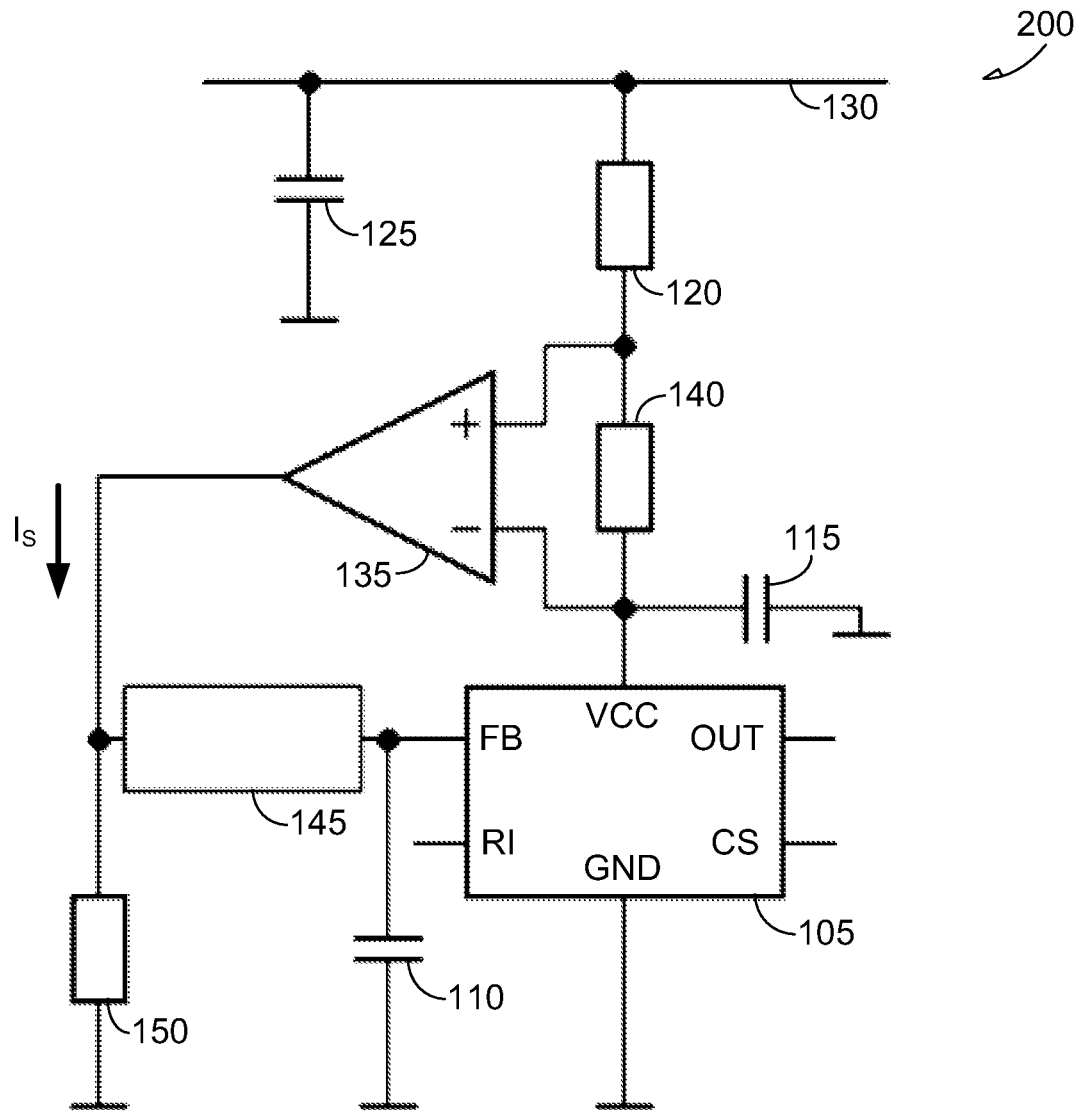
FIG. 2 illustrates generally an example of a system including a controller and additional circuitry, the system configured to sense an input voltage using a transconductance (GM) amplifier.

FIG. 2 illustrates generally an example of a system 200 including a controller 105 and additional circuitry, the system 200 configured to sense an input voltage, such as from a bulk input voltage (VBULK) 130, using a transconductance (GM) amplifier 135. In an example, the controller 105 can include one or more pins, such as an input voltage pin (VCC), a ground pin (GND), an output pin (OUT), a feedback pin (FB), a reference input pin (RI), and a current sense pin (CS). In other examples, the controller 105 can include one or more other pins.

In an example, the additional circuitry can include a feedback capacitor 110, a VCC capacitor 115, a startup resistor 120, a bulk capacitor 125, a current sense resistor 140, a protection circuit 145 (e.g., a brown-out circuit, an over voltage protection circuit, one or more other protection circuits, combinations thereof, etc.), and a protection circuitry input load 150, such as a resistor (e.g., a passive resistor, a semiconductor resistor, etc.), an input resistance of the protection circuit 145, a current mirror, etc. In an example, the VCC capacitor 115 can be charged from VBULK 130 through the startup resistor 120 and the current sense resistor 140 using a charging current. The charging current can be sensed using the current sense resistor 140 and transformed into a sense current ($I_S$) using the GM amplifier 135.

In the example of FIG. 2, the sense current is proportional to the voltage across the current sense resistor 140 and the gain of the GM amplifier 135. The voltage across the current sense resistor 140 can be given by a relationship between (1) the ration of the values of the startup resistor 120 and the current sense resistor 140 and (2) the voltage difference between VBULK 130 and the voltage at the VCC pin of the controller 105. In an example, the sense current ($I_S$) can create a voltage across the protection circuitry input load 150 that can be used to control the protection circuit 145, such as at least one of a brown-out protection circuit, an over voltage protection circuit, or one or more other protection circuits.

In an example, the protection circuit 145 can be configured to provide information to the controller 105 using the feedback pin or one or more other pins, such as to limit operating parameters of the controller 105 or to provide operating range information to the controller 105, for example, to reduce power in response to load conditions, to prevent damage due to abnormal conditions, etc.

Figure 3:
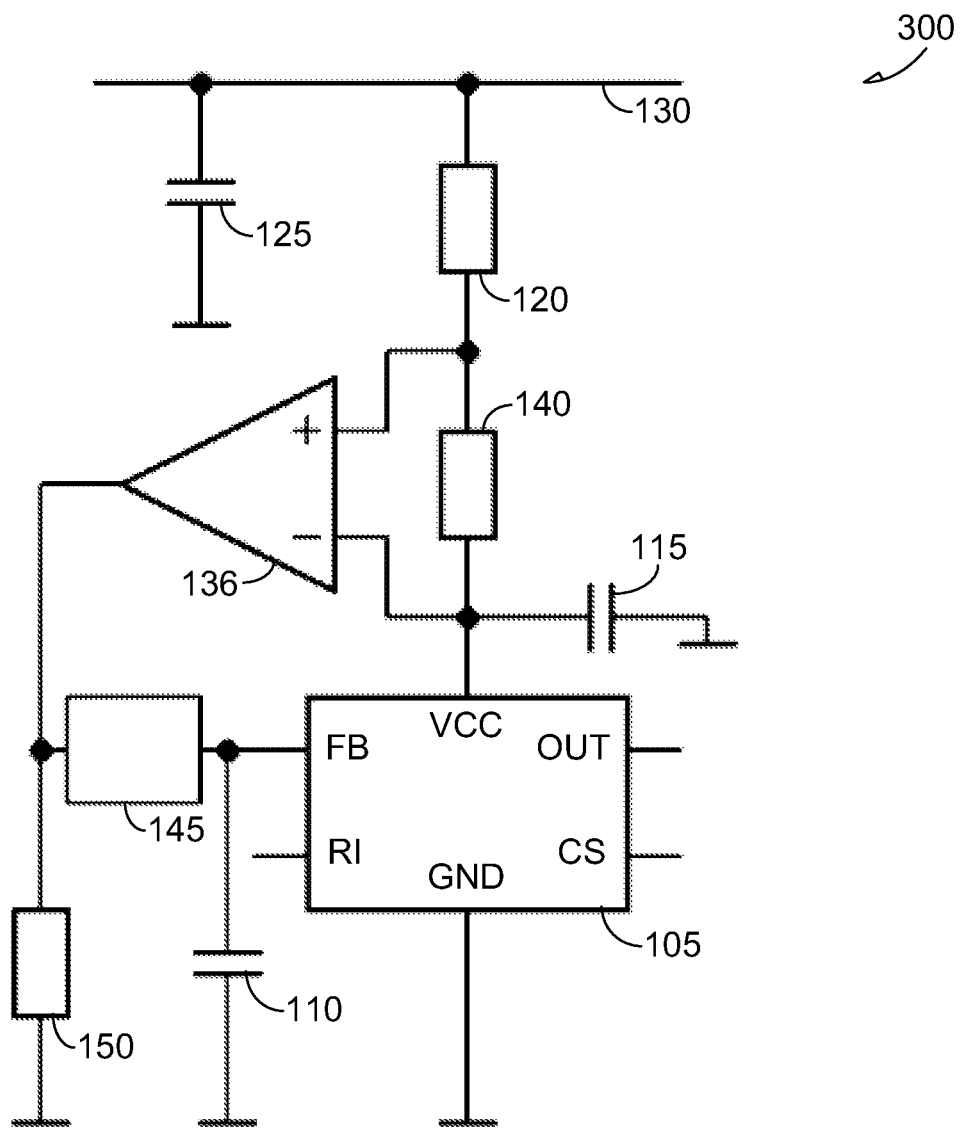
FIG. 3 illustrates generally an example of a system including a controller and additional circuitry, the system configured to sense an input voltage using a comparator 136.

FIG. 3 illustrates generally an example of a system 300 including a controller 105 and additional circuitry, the system 300 configured to sense an input voltage, such as from a bulk input voltage (VBULK) 130, using a comparator 136. In an example, the controller 105 can include one or more pins, such as an input voltage pin (VCC), a ground pin (GND), an output pin (OUT), a feedback pin (FB), a reference input pin (RI), and a current sense pin (CS). In other examples, the controller 105 can include one or more other pins.

In an example, the additional circuitry can include a feedback capacitor 110, a VCC capacitor 115, a startup resistor 120, a bulk capacitor 125, a current sense resistor 140, a protection circuit 145 (e.g., a brown-out circuit, one or more other protection circuits, combinations thereof, etc.), and a protection circuitry input load 150. In an example, the VCC capacitor 115 can be charged from VBULK 130 through the startup resistor 120 and the current sense resistor 140 using a charging current. The charging current can be sensed using the current sense resistor 140 and compared using the comparator 136. In certain examples, the comparator 136 can, among other things, determine if the voltage at VBULK 130 is higher or lower than the voltage at VCC or on the VCC capacitor 115, such as to detect a loss of or decrease in input voltage. The output of the comparator 136 can create a voltage across the protection circuitry input load 150 that can be used to control the protection circuit 145, such as at least one of a brown-out protection circuit, or one or more other protection circuits.

Figure 4:
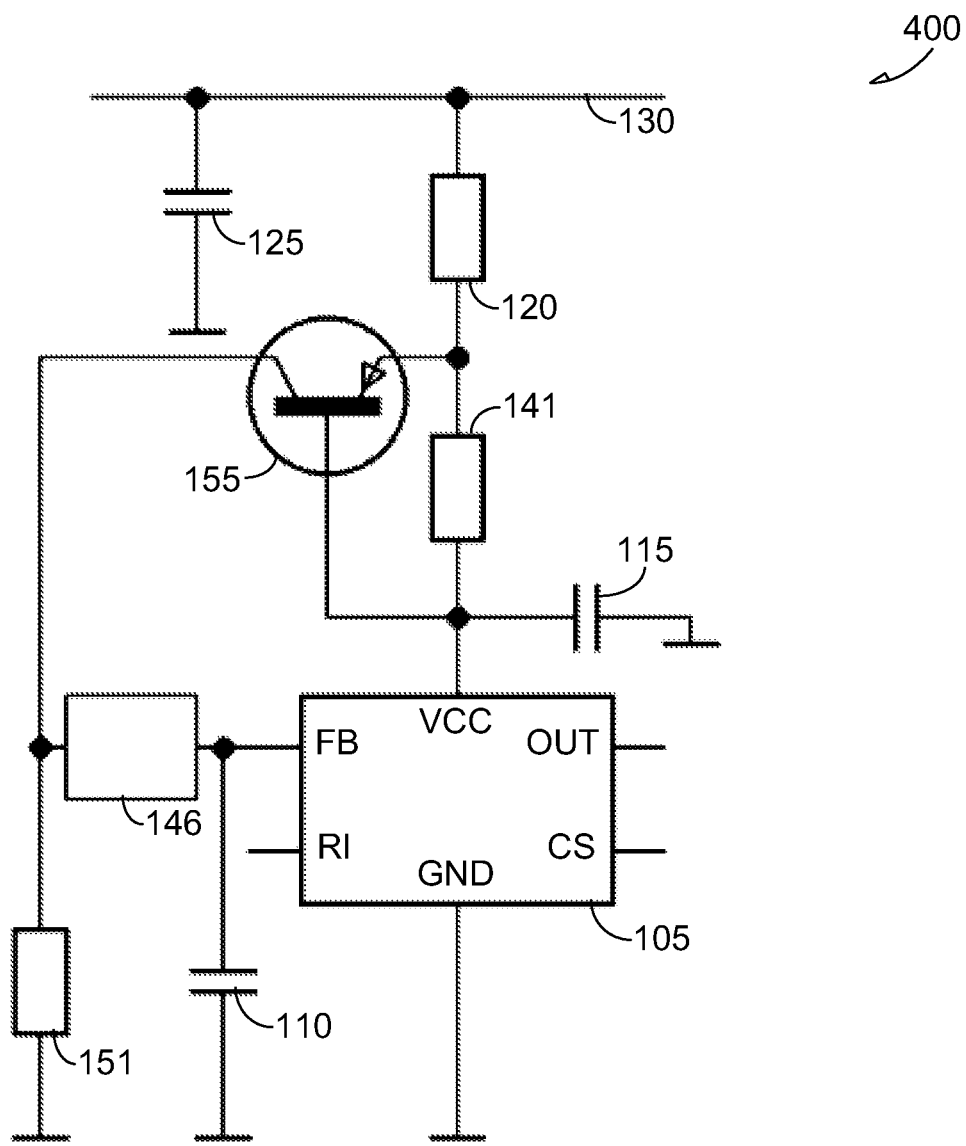
FIGS. 4-5 illustrate generally examples of a system including a controller and additional circuitry, the system configured to sense an input voltage using a first transistor.

FIG. 4 illustrates generally an example of a system 400 including a controller 105 and additional circuitry, the system 400 configured to sense an input voltage, such as from a bulk input voltage (VBULK) 130, using a first transistor 155 (e.g., a bipolar junction transistor (BJT) or one or more other transistors). In an example, the controller 105 can include one or more pins, such as an input voltage pin (VCC), a ground pin (GND), an output pin (OUT), a feedback pin (FB), a reference input pin (RI), and a current sense pin (CS). In other examples, the controller 105 can include one or more other pins.

In an example, the additional circuitry can include a feedback capacitor 110, a VCC capacitor 115, a startup resistor 120, a bulk capacitor 125, a first resistor 141, a filter circuit 146 (e.g., a low pass filter (LPF), one or more other filters, etc.), and a second resistor 151. In the example of FIG. 4, the first transistor 155 can include a PNP BJT having a base, an emitter, and a collector.

In an example, the VCC capacitor 115 can be charged from VBULK 130 using a charging current through the startup resistor 120 and the base-emitter junction of the first transistor 155. The first resistor 141 can be configured to protect the base-emitter junction of the first transistor 155 against reverse breakdown when the voltage at VBULK 130 is low, or lower than the voltage at VCC. When the voltage at VBULK 130 is higher than the voltage at VCC, the charging current can open the emitter-collector junction of the transistor 155, and the collector current can flow through the second resistor 151 to ground, creating a voltage drop across the second resistor 151. In an example, the shape of the voltage drop across the second resistor 151 (generally a square wave) can be proportional to the input voltage (e.g., the voltage at VBULK 130) higher than the voltage at VCC.

In an example, the filter circuit 146 can be configured to integrate the voltage drop across the second resistor 151, and in certain examples, the averaged value can be used to control the controller 105 (e.g., to control a dimming function or one or more other functions of the controller 105).

Figure 5:
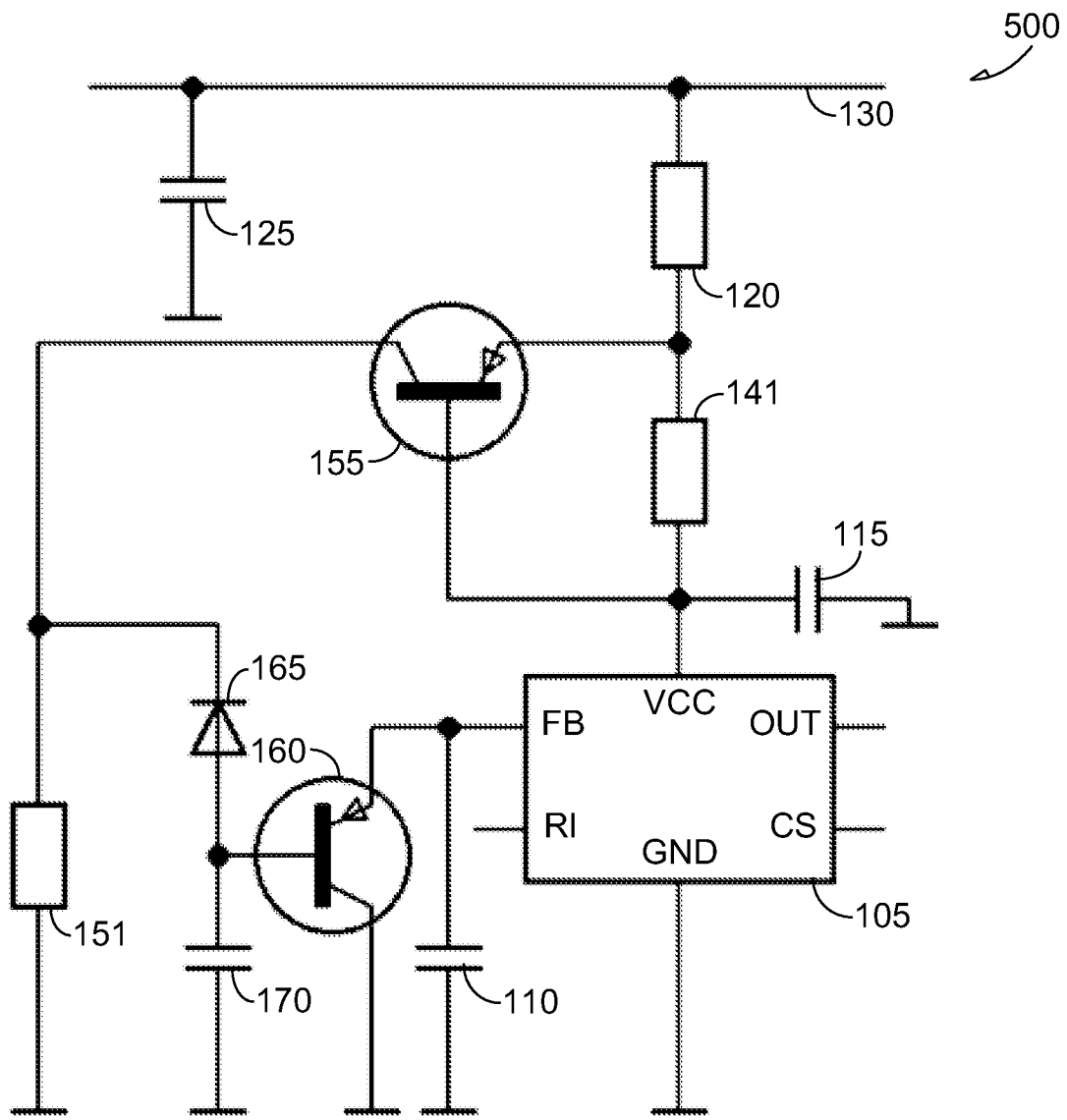

FIG. 5 illustrates generally an example of a system 500 including a controller 105 and additional circuitry, the system 500 configured to sense an input voltage, such as from a bulk input voltage (VBULK) 130, using a first transistor 155 (e.g., a bipolar junction transistor (BJT) or one or more other transistors). In an example, the controller 105 can include one or more pins, such as an input voltage pin (VCC), a ground pin (GND), an output pin (OUT), a feedback pin (FB), a reference input pin (RI), and a current sense pin (CS). In other examples, the controller 105 can include one or more other pins.

In an example, the additional circuitry can include a feedback capacitor 110, a VCC capacitor 115, a startup resistor 120, a bulk capacitor 125, a first resistor 141, a second resistor 151, a second transistor 160 (e.g., a BJT or one or more other transistors), a diode 165, and an integrating capacitor 170. In the example of FIG. 4, the first and second transistors 155, 160 can include PNP BJTs each having a base, an emitter, and a collector.

In an example, the VCC capacitor 115 can be charged from VBULK 130 using a charging current through the startup resistor 120 and the base-emitter junction of the first transistor 155. The first resistor 141 can be configured to protect the base-emitter junction of the first transistor 155 against reverse breakdown when the voltage at VBULK 130 is low, or lower than the voltage at VCC. When the voltage at VBULK 130 is higher than the voltage at VCC, the charging current can open the emitter-collector junction of the transistor 155, and the collector current can flow through the second resistor 151 to ground, creating a voltage drop across the second resistor 151. In an example, the shape of the voltage drop across the second resistor 151 (generally a square wave) can be proportional to the input voltage (e.g., the voltage at VBULK 130) higher than the voltage at VCC.

In an example, when the voltage drop across the second resistor 151 is low (e.g., with respect to the voltage on the integrating capacitor 170 and the drop across the diode 165, with respect to a reference or a threshold, etc.), the integrating capacitor 170 can be discharge through the diode 165 and the second resistor 151. When the voltage drop across the second resistor 151 is high (e.g., with respect to the voltage on the integrating capacitor 170, etc.) the integrating capacitor 170 can be charged from the feedback pin through the second transistor 160 (e.g., in an emitter-follower configuration). In an example, the resulting voltage on the emitter of the second transistor 160 can reflect the input voltage angle and duty cycle and can regulate the output power of the controller 105 as a dimming function or one or more other functions of the controller 105.

ADDITIONAL NOTES AND EXAMPLES

In Example 1, a system includes a controller and an input voltage sensing circuit. The controller can be configured to receive an input voltage from a startup circuit, the startup circuit including a startup resistor configured to limit a charging current from a bulk voltage. The input voltage sensing circuit can be configured to detect the charging current, without providing a direct path from the startup resistor to ground through another resistor, and to provide information representative of the charging current to the controller.

In Example 2, the input voltage sensing circuit of Example 1 is optionally configured to detect a difference between the bulk voltage and the input voltage and to provide a voltage representative of the difference.

In Example 3, the input voltage sensing circuit of any one or more of Examples 1-2 optionally includes an amplifier including a positive input coupled to the startup resistor, a negative input coupled to the controller, and an output, the input voltage sensing circuit further optionally including a first resistor coupled between the positive and negative inputs, and a load coupled to the output.

In Example 4, the amplifier of any one or more of Examples 1-3 optionally includes a transconductance (GM) amplifier configured to provide a sense current at the output proportionate to a voltage across the first resistor, the sense current configured to provide a voltage representative of the charging current across the load.

In Example 5, any one or more of Examples 1-4 optionally includes a protection circuit configured to receive the information representative of the charging current and to provide information to the controller.

In Example 6, the protection circuit of any one or more of Examples 1-5 optionally includes at least one of a brown-out protection circuit or an over voltage protection circuit.

In Example 7, the amplifier of any one or more of Examples 1-6 optionally includes a comparator configured to provide a first signal when the voltage at the positive input is higher than the voltage at the negative input, and to provide a second signal when the voltage at the negative input is higher than the voltage at the positive input.

In Example 8, the input voltage sensing circuit of any one or more of Examples 1-7 optionally includes a first PNP bipolar junction transistor (BJT) including an emitter coupled to the startup resistor, a base coupled to the controller, and a collector, the input voltage voltage sensing circuit further optionally including a first resistor coupled between the emitter of the first PNP BJT and the base of the first PNP BJT and a second resistor coupled to the collector of the first PNP BJT.

In Example 9, when the voltage at the emitter of the first PNP BJT of any one or more of Examples 1-8 exceeds the voltage at the base of the first PNP BJT by a threshold, a current is optionally provided through the second resistor from the collector of the first PNP BJT, providing a voltage representative of the charging current.

In Example 10, any one or more of Examples 1-9 optionally includes a filter circuit coupled to the collector of the first PNP BJT, the filter circuit configured to receive the voltage representative of the charging current and to provide an averaged voltage representative of the charging current.

In Example 11, any one or more of Examples 1-10 optionally includes a dimming circuit including a second PNP BJT including an emitter, a base, and a collector, wherein the emitter is configured to provide charging current information to the controller, the dimming circuit further including a diode including an anode coupled to the base of the second PNP BJT and a cathode coupled to the collector of the first PNP BJT, and a capacitor coupled to the base of the second PNP BJT.

In Example 12, the input voltage sensing circuit of any one or more of Examples 1-11 optionally includes discrete components, and the controller of any one or more of Examples 1-11 optionally includes a pulse-width modulation (PWM) controller.

In Example 13, a method includes limiting a charging current from a bulk voltage to a controller using a startup circuit, detecting the charging current using an input voltage sensing circuit without providing a direct path from the startup circuit to ground through a resistor, and providing information representative of the charging current to the controller.

In Example 14, the detecting the charging current of any one or more of Examples 1-13 optionally includes receiving a voltage across a first resistor coupled between positive and negative inputs of an amplifier, the positive input configured to be coupled to the startup circuit and the negative input configured to be coupled to the controller, and any one or more of Examples 1-13 optionally further includes providing a voltage across a load coupled to an output of the amplifier representative of the voltage across the first resistor.

In Example 15, the amplifier of any one or more of Examples 1-14 optionally includes a transconductance (GM) amplifier, and any one or more of Examples 1-14 optionally further includes providing a sense current at the output of the amplifier proportionate to the voltage across the first resistor.

In Example 16, the amplifier of any one or more of Examples 1-15 optionally includes a comparator, and any one or more of Examples 1-15 optionally further includes providing a first signal at the output of the comparator when the voltage at the positive input of the comparator is higher than the voltage at the negative input of the comparator and providing a second signal at the output of the comparator when the voltage at the negative input of the comparator is higher than the voltage at the positive input of the comparator.

In Example 17, the detecting the charging current includes receiving a voltage at an emitter of a first PNP bipolar junction transistor (BJT), the first PNP BJT including a base coupled to the controller and coupled to the emitter through a first resistor, and any one or more of Examples 1-16 optionally further includes providing a current through a second resistor coupled to a collector of the first PNP BJT when the voltage at the emitter of the first PNP BJT exceeds the voltage at the base of the first PNP BJT by a threshold.

In Example 18, an apparatus includes an input voltage sensing circuit configured to detect a charging current from a startup circuit, without providing a direct path from the startup resistor to ground through another resistor, and to provide information representative of the charging current to a controller.

In Example 19, the input voltage sensing circuit of any one or more of Examples 1-18 optionally includes an amplifier including a positive input coupled to the startup resistor, a negative input coupled to the controller, and an output, the input voltage sensing circuit further optionally including a first resistor coupled between the positive and negative inputs and a load coupled to the output.

In Example 20, the amplifier of any one or more of Examples 1-19 optionally includes a transconductance (GM) amplifier configured to provide a sense current at the output proportionate to a voltage across the first resistor, the sense current configured to provide a voltage representative of the charging current across the load.

In Example 21, the amplifier of any one or more of Examples 1-20 optionally includes a comparator configured to provide a first signal when the voltage at the positive input is higher than the voltage at the negative input, and to provide a second signal when the voltage at the negative input is higher than the voltage at the positive input.

In Example 22, the input voltage sensing circuit of any one or more of Examples 1-21 optionally includes a first PNP bipolar junction transistor (BJT) including an emitter coupled to the startup resistor, a base coupled to the controller, and a collector, the input voltage sensing circuit further optionally including a first resistor coupled between the emitter of the first PNP BJT and the base of the first PNP BJT, and a second resistor coupled to the collector of the first PNP BJT.

In Example 23, a system or apparatus can include, or can optionally be combined with any portion or combination of any portions of any one or more of Examples 1-22 to include, means for performing any one or more of the functions of Examples 1-22, or a machine-readable medium including instructions that, when performed by a machine, cause the machine to perform any one or more of the functions of Examples 1-22.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, although the examples above have been described relating to PNP devices, one or more examples can be applicable to NPN devices. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A system comprising:
    a controller configured to receive an input voltage from a startup circuit, the startup circuit including a startup resistor configured to limit a charging current from a bulk voltage; and
    an input voltage sensing circuit configured to detect the charging current, without providing a direct path from the startup resistor to ground through another resistor, and to provide information representative of the charging current to the controller, wherein the input voltage sensing circuit includes:
        a first PNP bipolar junction transistor (BJT) including an emitter coupled to the startup resistor, a base coupled to the controller, and a collector;
        a first resistor coupled between the emitter of the first PNP BJT and the base of the first PNP BJT; and
        a second resistor coupled to the collector of the first PNP BJT.

2. The system of claim 1, wherein, when the voltage at the emitter of the first PNP BJT exceeds the voltage at the base of the first PNP BJT by a threshold, a current is provided through the second resistor from the collector of the first PNP BJT, providing a voltage representative of the charging current.

3. The system of claim 2, including a filter circuit coupled to the collector of the first PNP BJT, the filter circuit configured to receive the voltage representative of the charging current and to provide an averaged voltage representative of the charging current.

4. The system of claim 2, including a dimming circuit including:
    a second PNP BJT including an emitter, a base, and a collector, wherein the emitter is configured to provide charging current information to the controller;
    a diode including an anode coupled to the base of the second PNP BJT and a cathode coupled to the collector of the first PNP BJT; and
    a capacitor coupled to the base of the second PNP BJT.

5. The system of claim 1, wherein the input voltage sensing circuit is configured to detect a difference between the bulk voltage and the input voltage and to provide a representative of the difference.

6. The system of claim 1, including a protection circuit configured to receive the information representative of the charging current and to provide information to the controller.

7. The system of claim 6, wherein the protection circuit includes at least one of a brown-out protection circuit or an over voltage protection circuit.

8. The system of claim 1, wherein the input voltage sensing circuit includes discrete components; and
    wherein the controller includes a pulse-width modulation (PWM) controller.

9. A method comprising:
    limiting a charging current from a bulk voltage to a controller using a startup circuit
    detecting the charging current using an input voltage sensing circuit without providing a direct path from the startup circuit to ground through a resistor, including receiving a voltage at an emitter of a first PNP bipolar junction transistor (BJT), the first PNP BJT including a base coupled to the controller and coupled to the emitter through a first resistor; and
    providing information representative of the charging current to the controller, including providing a current through a second resistor coupled to a collector of the first PNP BJT when the voltage at the emitter of the first PNP BJT exceeds the voltage at the base of the first PNP BJT by a threshold.

10. The method of claim 9, including:
detecting a difference between the bulk voltage and the input voltage using the input voltage sensing circuit; and
providing, using the input voltage sensing circuit, a representative of the difference.

11. The method of claim 9, including:
receiving the information representative of the charging current at a protection circuit; and
providing information, using the received information representative of the charging current, to the controller.

12. The method of claim 11, wherein the protection circuit includes at least one of a brown-out protection circuit or an over voltage protection circuit.

13. The method of claim 9, including providing a current through the second resistor from the collector of the first PNP BJT when the voltage at the emitter of the first PNP BJT exceeds the voltage at the base of the first PNP BJT by a threshold.

14. The method of claim 9, including:
receiving the voltage representative of the charging current at a filter circuit coupled to the collector of the first PNP BJT; and
providing, using the filter circuit, an averaged voltage representative of the charging current.

15. The method of claim 9, including:
providing charging current information to the controller using a dimming circuit,
wherein the dimming circuit includes:
a second PNP BJT including an emitter, a base, and a collector;
a diode including an anode coupled to the base of the second PNP BJT and a cathode coupled to the collector of the first PNP BJT; and
a capacitor coupled to the base of the second PNP BJT.

16. The method of claim 9, wherein the input voltage sensing circuit includes discrete components; and
wherein the controller includes a pulse-width modulation (PWM) controller.

17. An apparatus comprising:
an input voltage sensing circuit configured to detect a charging current from a startup circuit, without providing a direct path from the startup resistor to ground through another resistor, and to provide information representative of the charging current to a controller, wherein the input voltage sensing circuit includes:
a first PNP bipolar junction transistor (BJT) including an emitter coupled to the startup resistor, a base coupled to the controller, and a collector;
a first resistor coupled between the emitter of the first PNP BJT and the base of the first PNP BJT; and
a second resistor coupled to the collector of the first PNP BJT.

18. The system of claim 17, including a protection circuit configured to receive the information representative of the charging current and to provide information to the controller.

19. The system of claim 18, wherein the protection circuit includes at least one of a brown-out protection circuit or an over voltage protection circuit.

20. The system of claim 17, wherein, when the voltage at the emitter of the first PNP BJT exceeds the voltage at the base of the first PNP BJT by a threshold, a current is provided through the second resistor from the collector of the first PNP BJT, providing a voltage representative of the charging current.

21. The system of claim 17, wherein, when the voltage at the emitter of the first PNP BJT exceeds the voltage at the base of the first PNP BJT by a threshold, a current is provided through the second resistor from the collector of the first PNP BJT, providing a voltage representative of the charging current.

22. The system of claim 21, including a filter circuit coupled to the collector of the first PNP BJT, the filter circuit configured to receive the voltage representative of the charging current and to provide an averaged voltage representative of the charging current.

23. The system of claim 21, including a dimming circuit including:
a second PNP BJT including an emitter, a base, and a collector, wherein the emitter is configured to provide charging current information to the controller;
a diode including an anode coupled to the base of the second PNP BJT and a cathode coupled to the collector of the first PNP BJT; and
a capacitor coupled to the base of the second PNP BJT.

24. The system of claim 17, wherein the input voltage sensing circuit includes discrete components; and
wherein the controller includes a pulse-width modulation (PWM) controller.

* * * * *